United States Patent
Oswald et al.

(10) Patent No.: US 6,858,461 B2
(45) Date of Patent: Feb. 22, 2005

(54) PARTIALLY TRANSPARENT PHOTOVOLTAIC MODULES

(75) Inventors: Robert S. Oswald, Mechanicsville, VA (US); Shengzhong Liu, Mechanicsville, VA (US)

(73) Assignee: BP Corporation North America Inc., Warrenville, IL (US)

( * ) Notice: Subject to any disclaimer, the term of this patent is extended or adjusted under 35 U.S.C. 154(b) by 0 days.

(21) Appl. No.: 10/131,859

(22) Filed: Apr. 25, 2002

(65) Prior Publication Data

US 2002/0119592 A1 Aug. 29, 2002

Related U.S. Application Data

(63) Continuation of application No. 09/891,752, filed on Jun. 26, 2001, now abandoned.
(60) Provisional application No. 60/216,415, filed on Jul. 6, 2000, provisional application No. 60/220,346, filed on Jul. 24, 2000, and provisional application No. 60/221,627, filed on Jul. 28, 2000.

(51) Int. Cl.$^7$ .......................... H01L 21/00; H01L 21/44; H01L 21/301
(52) U.S. Cl. ........................... 438/68; 438/113; 438/463
(58) Field of Search ................ 438/68, 113, 114, 438/460, 462, 463, 465

(56) References Cited

U.S. PATENT DOCUMENTS

| | | | |
|---|---|---|---|
| 4,292,092 A | 9/1981 | Hanak | 148/1.5 |
| 4,721,629 A | 1/1988 | Sakai et al. | 427/35 |
| 4,724,011 A | 2/1988 | Turner et al. | 136/249 |
| 4,795,500 A | 1/1989 | Kishi et al. | 136/244 |
| 4,892,592 A | 1/1990 | Dickson et al. | 136/244 |
| 5,176,758 A | 1/1993 | Nath et al. | 136/251 |
| 5,254,179 A | 10/1993 | Ricaud et al. | 136/244 |
| 5,468,652 A * | 11/1995 | Gee | 437/2 |
| 5,693,181 A * | 12/1997 | Bernstein | 156/644.1 |
| 6,136,668 A * | 10/2000 | Tamaki et al. | 438/462 |
| 6,265,652 B1 * | 7/2001 | Kurata et al. | 136/244 |
| 6,420,245 B1 * | 7/2002 | Manor | 438/460 |
| 6,441,300 B2 * | 8/2002 | Sannomiya et al. | 136/251 |
| 6,455,347 B1 * | 9/2002 | Hiraishi et al. | 438/80 |

FOREIGN PATENT DOCUMENTS

JP 63289969 11/1988

OTHER PUBLICATIONS

Leppanen, et al., "Manufacturing Options for Large a–Si PV Façade Elements," Engineering Conference, Vienna, Austria, Jul. 6–10, 1998, vol. 3, Jul. 6, 1998, pp. 2575–2578.

Stark et al., "Konstruktive Varianten Beim Modulaufbau," Photovoltaik Architektonische Gebaeudeintegration, XX, XX, Jul. 2000, pp. 10–15; 18–19, 25–26, 32–37.

* cited by examiner

*Primary Examiner*—Alexander Ghyka
(74) *Attorney, Agent, or Firm*—Thomas E. Nemo

(57) ABSTRACT

A photovoltaic cell comprising a supporting substrate, a front contact layer on the substrate, a layer or layers of semiconductor material and a back contact layer comprising a metal, the back contact having areas without metal thereby permitting the passage of light through the cell.

19 Claims, 8 Drawing Sheets

PARTIALLY TRANSPARENT PHOTOVOLTAIC MODULES

This is a continuation of application Ser. No. 09/891,752 now abandoned filed Jun. 26, 2001, which in turn claims benefit of U.S. Provisional Application Ser. Nos. 60/221,627 filed Jul. 28, 2000, 60/220,346 filed Jul. 24, 2000 and 60/216,415 filed Jul. 6, 2000.

FIELD OF THE INVENTION

The present invention relates to partially transparent photovoltaic cells and modules and methods for their manufacture. More particularly, the present invention relates to partially transparent amorphous silicon photovoltaic cells and modules wherein the transparency is provided by removing at least part of the back contact layer of the photovoltaic cell. This invention also relates to photovoltaic modules where the removal of the back contact can be used to form a design or logo on the photovoltaic modules so that when viewed from the front or back the design or logo is apparent.

A conventional thin film photovoltaic cell typically includes a front contact disposed on a substrate wherein the front contact is made of, for example, a metal oxide such as tin oxide, a p-i-n or PIN junction and a back or rear contact made of, for example, a metal such as aluminum. The p-i-n or PIN junction includes a layer of a semiconductor material doped with a p-type dopant to form a p-layer, an undoped layer of a semiconductor material that forms an intrinsic or i-layer, and a layer of a semiconductor material doped with an n-type dopant to form an n-layer. Light incident on the substrate passes through the substrate, the front contact, and the p-i-n junction. The light is reflected by the rear contact back into the p-i-n junction However, since the back contact generally covers the entire surface of the photovoltaic cell, the cell is opaque when the back contact is made of a metal such as aluminum and does not transmit or allow any light to pass through. In certain applications, however, it would be desirable to have a photovoltaic cell that is efficient for converting light energy into electrical energy yet provides for the transmission of light through the cell. It would also be desirable to have an efficient method to manufacture such photovoltaic cells. Photovoltaic cells with such capability would be very desirable in applications of the photovoltaic cell such as windows, sun screens, canopies and other uses where it is desirable to see through the photovoltaic cell or to have a certain amount of the light incident on the cell pass through the cell. The present invention provides for such a photovoltaic cell, modules comprising such cells, and an efficient method for their manufacture.

SUMMARY OF THE INVENTION

This invention is a method of manufacturing a photovoltaic device on a monolithic substrate, comprising the steps of:

(a) depositing a transparent conductive oxide film on a monolithic substrate to form a front contact layer;

(b) laser scribing substantially parallel first grooves in the front contact layer with a laser beam to form front electrode segments on the monolithic substrate;

(c) depositing and forming a layer or layers of a semiconductor material on said front electrode segments, and filling the first grooves with the semiconductor material;

(d) laser scribing second grooves in the layer or layers of semiconductor material at positions substantially parallel to the first grooves;

(e) depositing and forming a back contact layer comprising a metal on the layer or layers of semiconductor material, and filling the second grooves with the metal to form a series connection to connect the front electrode segments and the back contact layer;

(f) laser scribing third grooves in the back contact layer at positions substantially parallel to said second grooves with a laser beam;

(g) laser scribing grooves in the back contact layer at a direction which crosses the direction of the second groove.

This invention is also a method of manufacturing a photovoltaic device on a monolithic substrate, comprising the steps of:

(a) depositing a transparent conductive oxide film on a monolithic substrate to form a front contact layer;

(b) laser scribing substantially parallel first grooves in the front contact layer with a laser beam to form front electrode segments on the monolithic substrate;

(c) depositing and forming a layer or layers of a semiconductor material on the front electrode segments, and filling the first grooves with the semiconductor material;

(d) laser scribing second grooves in the layer or layers of semiconductor material at positions substantially parallel to the first grooves;

(e) depositing and forming a back contact layer comprising a metal on the layer of semiconductor material, and filling the second grooves with the metal to form a series connection to connect the front electrode segments and the back contact layer;

(f) laser scribing third grooves in the back contact layer at positions substantially parallel to the second grooves with a laser beam;

(g) selectively removing sections of the back contact using a laser to impart a desired design, lettering, logo or other feature to the photovoltaic device.

This invention is also a photovoltaic cell comprising a supporting substrate, a front contact layer on the substrate, a layer or layers of semiconductor material and a back contact layer comprising a metal, the back contact having areas without metal thereby permitting the passage of light through the cell.

This invention is also a method for making a partially transparent photovoltaic module comprising series connected cells, at least one amorphous semiconductor layer, a metal contact layer, and interconnects connecting the series-connected cells, the method comprising laser scribing a plurality of laser scribes at least through the metal contact and positioning the scribes in a direction that crosses the direction of the interconnects.

This invention is also a method of making a photovoltaic module comprising series connected cells, at least one amorphous semiconductor layer, a metal contact layer, and interconnects connecting the series-connected cells comprising selectively removing portions of the metal contact using a laser for the purpose of permitting light to pass through the module where the metal is selectively removed.

This invention is also a partially transparent photovoltaic module comprising series connected cells, at least one amorphous semiconductor layer, a metal contact layer, and interconnects connecting the series-connected cells, the module comprising a plurality of scribes at least through the metal contact layer positioned in a direction that crosses the direction of the interconnects.

DETAILED DESCRIPTION OF THE INVENTION

Photovoltaic cells that convert radiation and particularly solar radiation into usable electrical energy can be fabricated by sandwiching certain semiconductor structures, such as, for example, the amorphous silicon PIN structure disclosed in U.S. Pat. No. 4,064,521, between two electrodes. One of the electrodes typically is transparent to permit solar radiation to reach the semiconductor material. This "front" electrode (or contact) can be comprised of a thin film, for example, less than 10 micrometers in thickness of transparent conductive oxide material, such as tin oxide, and usually is formed between a transparent supporting substrate made of glass or plastic and the photovoltaic semiconductor material. The "back" or "rear" electrode (or contact), which is formed on the surface of the semiconductor material opposite the front electrode, generally comprises a thin film of metal such as, for example, aluminum or silver, or the like, or a thin film of metal and a thin film of a metal oxide such as zinc oxide between the semiconductor material and the metal thin film. The metal oxide can be doped with boron or aluminum and is typically deposited by low pressure chemical vapor deposition.

FIG. 1 shows thin film photovoltaic module 10 comprised of a plurality of series-connected photovoltaic cells 12 formed on a transparent substrate 14, e.g., glass, and subjected to solar radiation or other light 16 passing through substrate 14 (A series of photovoltaic cells is a module.) Each photovoltaic cell 12 includes a front electrode 18 of transparent conductive oxide, a transparent photovoltaic element 20 made of a semiconductor material, such as, for example, hydrogenated amorphous silicon, and a back or rear electrode 22 of a metal such as aluminum. Photovoltaic element 20 can comprise, for example, a PIN structure. Adjacent front electrodes 18 are separated by first grooves 24, which are filled with the semiconductor material of photovoltaic elements 20. The dielectric semiconductor material in first grooves 24 electrically insulates adjacent front electrodes 18. Adjacent photovoltaic elements 20 are separated by second grooves 26, which are filled with the metal of back electrodes 22 to provide a series connection between the front electrode of one cell and the back electrode of an adjacent cell. These connections are referred to herein as "interconnects." Adjacent back electrodes 22 are electrically isolated from one another by third grooves 28.

We discovered that the transmission of light through the photovoltaic cell and module can be accomplished by removing metal from the rear contact, preferably by a laser scribing process. We also discovered that the removal of metal from the back contact by the laser scribing method of this invention can be accomplished in a manner to impart a descriptive pattern or logo on the photovoltaic module. Additionally, we discovered partially transparent photovoltaic modules having exceptional photovoltaic performance can be manufactured by forming grooves in the back contact where the grooves run from one side of the photovoltaic module to the other and are disposed so they cross the interconnects, and preferably, cross perpendicular to the direction of the interconnects.

The thin-film photovoltaic module of FIG. 1 typically is manufactured by a deposition and patterning method. One example of a suitable technique for depositing a semiconductor material on a substrate is glow discharge in silane, as described, for example, in U.S. Pat. No. 4,064,521. Several patterning techniques are conventionally known for forming the grooves separating adjacent photovoltaic cells, including silkscreening with resist masks, etching with positive or negative photoresists, mechanical scribing, electrical discharge scribing, and laser scribing. Silkscreening and particularly laser scribing methods have emerged as practical, cost-effective, high-volume processes for manufacturing thin-film semiconductor devices, including thin-film amorphous silicon photovoltaic modules. Laser scribing has an additional advantage over silkscreening because it can separate adjacent cells in a multi-cell device by forming separation grooves having a width less than 25 micrometers, compared to the typical silkscreened groove width of approximately 300–500 micrometers. A photovoltaic module fabricated with laser scribing thus has a large percentage of its surface area actively engaged in producing electricity and, consequently, has a higher efficiency than a module fabricated by silkscreening. A method of laser scribing the layers of a photovoltaic module is disclosed in U.S. Pat. No. 4,292,092.

Referring to FIG. 1, a method of fabricating a multi-cell photovoltaic module using laser scribing comprises, depositing a continuous film of transparent conductive oxide on a transparent substrate 14, scribing first grooves 24 to separate the transparent conductive oxide film into front electrodes 18, fabricating a continuous film of semiconductor material on top of front electrodes 18 and in first grooves 24, scribing second grooves 26 parallel and adjacent to first grooves 24 to separate the semiconductor material into individual photovoltaic elements 20 (or "segments") and expose portions of front electrodes 18 at the bottoms of the second grooves, forming a continuous film of metal on segments 20 and in second grooves 26 so that the metal forms electrical connections with front electrodes 18, i.e., the interconnects, and then scribing third grooves 28 parallel and adjacent to second grooves 26 to separate and electrically isolate adjacent back electrodes 22. As shown in FIG. 1, the third grooves 28 are scribed in the metallic back electrode from the back contact side or face of the photovoltaic cell. The first and last cell of a module generally have bus bars which provide for a means to connect the module to wires or other electrically conductive elements. The bus bars generally run along the length of the outer, long portion of the first and last cell.

We discovered that the photovoltaic cells and modules such as the one described in FIG. 1 can be made partially transparent by scribing the back contact. We also discovered that the back contact can be removed in a specified pattern on the photovoltaic cell or module using a laser, and preferably a computer-controlled laser, such that the cell or module can have a logo or other sign such that when the photovoltaic cell or module is viewed the logo or sign is highly noticeable. The photovoltaic cell or module therefore functions both as a means for generating electric current and as a source of information such as an advertisement or means of identification. We also discovered that if it is desirable to have a photovoltaic module that transmits light without regard to the need to have a logo or other design or information on the photovoltaic cell, a highly efficient means for making such a module comprises scribing with a laser, or otherwise forming lines or interconnecting holes through the back contact and in a direction that crosses the direction of the interconnects of the photovoltaic module. Preferably, such scribe lines are perpendicular or nearly so to the direction of the interconnects. It is also preferable that such scribe lines run completely across the photovoltaic module up to but not crossing the bus bars of the first and last cells of the series of cells in a module. The number of such scribes which are made on the back contact will determine the degree of transparency. Of course, for each scribe, that amount of area of the cell becomes photovoltaically inactive. However, we determined that the scribes made in the manner described above, particularly where the scribe comprises a series of connected holes to form a line, provides for the least amount of loss of photovoltaic activity.

BRIEF DESCRIPTION OF THE DRAWINGS

The accompanying drawings, which are incorporated in and which constitute a part of the specification, illustrate at least one embodiment of the invention and, together with the description, explain the principles of the invention.

DESCRIPTION OF THE PREFERRED EMBODIMENTS

Reference now will be made in detail to the presently preferred embodiments of the invention, examples of which are illustrated in the accompanying drawings.

Figure 2A:
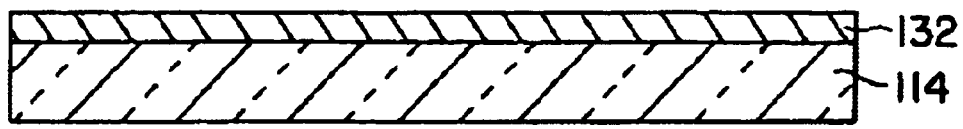
FIGS. 2(a)–2(g) are schematic cross sectional views depicting the steps in a method for fabricating another type of thin film photovoltaic module.
Figure 2B:
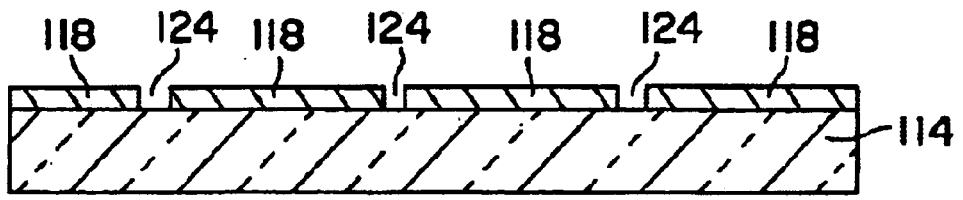
Figure 2C:
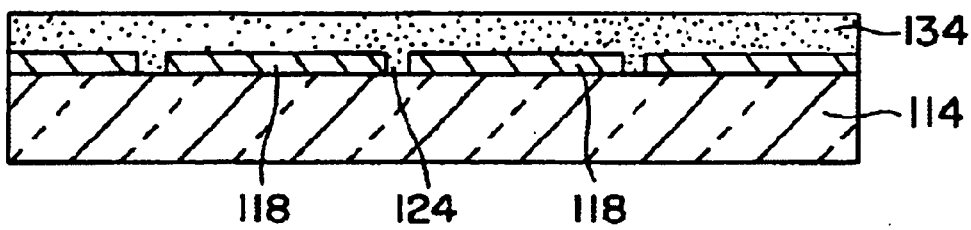
Figure 2D:
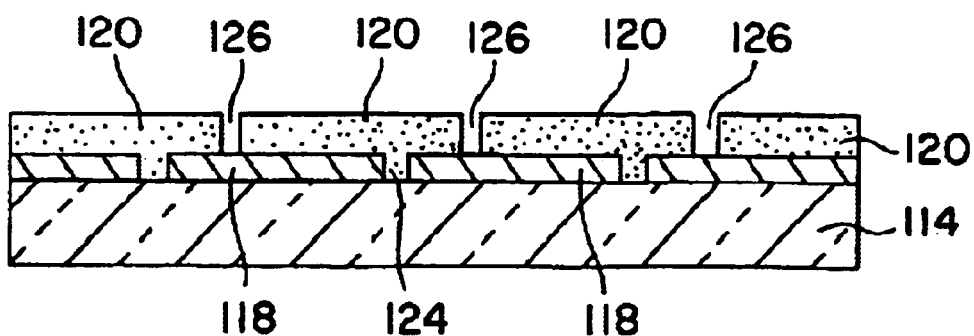
Figure 2E:
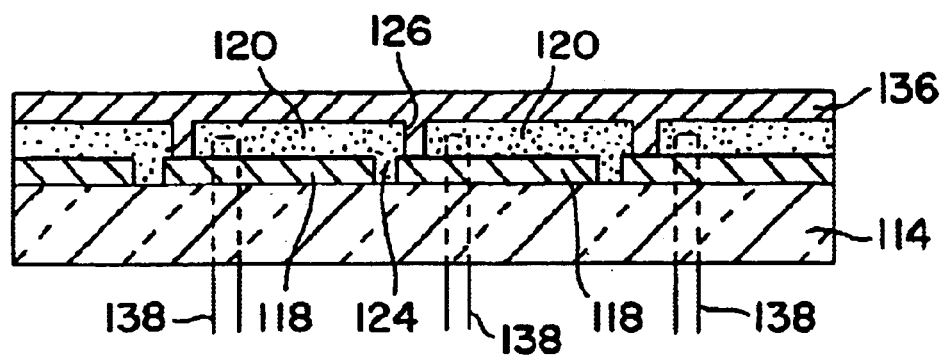
Figure 2F:
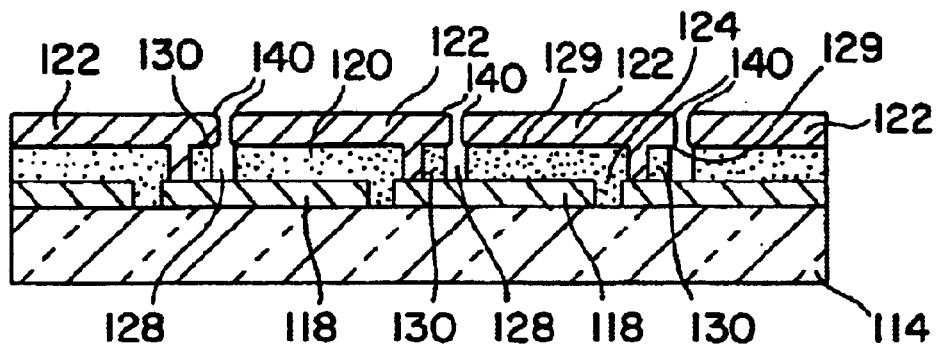
Figure 2G:
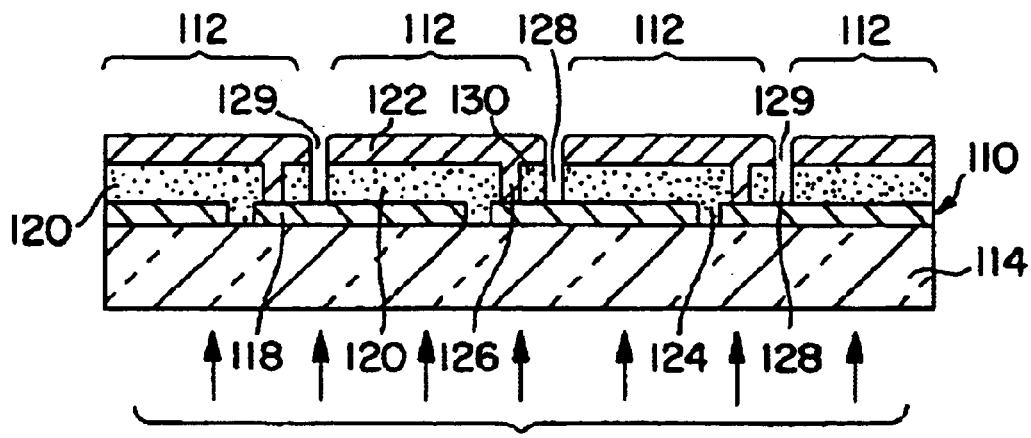

FIG. 2(g) is a schematic cross sectional view of a portion of a multi-cell thin-film photovoltaic module, designated generally by reference numeral 110. Photovoltaic module 110 is comprised of a plurality of series-connected photovoltaic cells 112 formed on a flat, transparent substrate 114. In operation, photovoltaic module 110 generates electricity in response to light, particularly solar radiation, 116, passing through substrate 114, which preferably is formed of glass. Each photovoltaic cell 112 includes a front electrode segment 118 of transparent conductive oxide, a photovoltaic element 120 made of semiconductor material, such as, for example, hydrogenated amorphous silicon, and a back electrode 122 comprising a metal, preferably aluminum, and optionally a metal oxide such as zinc oxide. Adjacent front electrode segments 118 are separated by first grooves 124, which are filled with the semiconductor material of photovoltaic elements 120. Adjacent photovoltaic elements 120 are separated by second grooves 126 and also by third grooves 128. An inactive portion 130 of semiconductor material is positioned between second groove 126 and third groove 128. Portions 130 are "inactive" in the sense that they do not contribute to the conversion of light 116 into electricity. Second grooves 126 are filled with the material of back electrodes 122 to provide a series connection between the front electrode of one cell and the back electrode of an adjacent cell. These connections are referred to as interconnects. Gaps 129, located at the tops of third grooves 128, separate and electrically isolate adjacent back electrodes 122. A series of photovoltaic cells, 112 as shown in FIG. 2(g) comprise a module. The module can have a large number of individual cells. Two or more modules can be connected in parallel to increase the current of the photovoltaic device. If a series of photovoltaic cells 112 are used, the contact of the first and last cell must be available for attaching a wire or other conductive element in order to connect the module to a device that will use the electric current generated by the module. Generally, a conductive strip or "bus bar" is added to the outside of the first and last cell in the module (i.e., parallel to the grooves). These bus bars are used to make the electrical connection to the device that will utilize the electrical current generated when the module is exposed to light.

In the preferred method of this invention a portion of the back contact is selectively removed or ablated by lasers to form a design on the back contact, or is scribed to produce a partially transparent photoelectric module. The scribing can be done by any means such as masking and etching or by mechanical scribing. However, we discovered that the preferred method for removing part of the rear contact is to use a laser. As described above, the selective removal of the metal of the rear contact can be accomplished in such a manner as to impart a design, lettering or logo to the photovoltaic module. This can be done to achieve shading, textures or three dimensional effects. The particular design or lettering or other feature to be added to the photovoltaic module can be stored in a computer or other memory system and such stored information can be recalled during the manufacturing process to quickly and accurately reproduce the desired design, lettering, logo or other feature on the photovoltaic module by directing the laser to scribe the pattern on the module by selectively removing the appropriate portions of the back contact.

If only transparency and not a design is desired, the rear contact can be scribed, again by one or more of the techniques mentioned above, to remove at least some of the back contact. Preferably a laser scribing process is used for this procedure as well. Preferably, such scribing is accomplished by scribing lines or grooves across the module in a pattern that crosses the interconnects, i.e., the scribe lines to produce partial transparency cross rather than run parallel to the interconnects. Preferably the scribe lines or grooves that are used to produce partial transparency of the photovoltaic module run perpendicular to the direction of the interconnects. Preferably the scribe lines for producing partial transparency are parallel to each other. The number of scribes that are added to the photovoltaic module to produce partial transparency of the module can vary depending on the desired transparency. Also the width of each scribe can vary depending on the desired transparency. Generally, the amount of back contact removed by the scribing is no more than about 50 percent of the area of the back contact, more preferably no more than about 20 percent of the back contact and most preferably no more than about 10 percent of the back contact. As stated above, the greater amount of the back contact removed, the more transparent the photovoltaic module will be. However, the more contact removed the less effective the module will be in generating electrical current when exposed to sunlight or other light sources. Generally, the spacing of the scribe lines is about 0.5 to about 5 millimeters (mm). More preferably about 0.5 to about 2 mm and most preferably about 0.5 to about 1.0 mm. The width of each scribe line is preferably about 0.5 to about 0.01 mm. More preferably about 0.2 to about 0.05 mm. The scribe line can be a solid line if, for example a laser scribing technique is used to form the line where the laser beam is projected as a linear beam. The scribe lines can also be in the form of a series or row of holes. The shape of the holes can be of any shape such as circles, squares or rectangles. Preferably, if the scribe lines are a series of small holes, and the holes are preferably connected or overlap so as to form a continuous scribe across all or a part of the surface of the photovoltaic module but not including the bus bars. Most preferably, the scribing is in the form of circular holes having a diameter of at least about 0.01 mm, preferably about 0.1 to about 0.2 mm. We have determined that circular holes, particularly when they are interconnected, lead to minimized power loss and maximized light transmission for the photovoltaic device.

When a laser is used to remove parts of the back contact to form the photovoltaic modules of this invention having the design or other such feature imparted to the photovoltaic module, or to form the photovoltaic module of this invention which is partially transparent, the laser used to remove the desired sections of the back contact is preferably a continuous wave laser or more preferably a pulsed laser. The laser can be an ultraviolet laser such as Excimer laser such as an KrF or ArCl laser and the like, or a third or forth harmonic of Nd:YAG, Nd:YLF and Nd:YVO$_4$ lasers. The laser can also be a visible or infrared laser. Most preferably, the laser used is a visible laser, preferably a green laser, for example, a frequency doubled Nd-YAG, Nd-YLF or Nd-YVO$_4$ laser. The laser can be directed to the top of the back contact so that the back contact is directly ablated or removed by the laser. In a preferred technique the laser beam is directed through the transparent substrate and through the transparent PIN component layers to ablate the rear contact. In a preferred method of operation, the laser is used to generate shock waves by using short pulses of high laser beam energy. We have determined that this enhances the removal of the back contact and reduces shunting. After the removal of the back contact, particularly after using the laser method, the photovoltaic cell is preferably cleaned, preferably using an ultrasonic bath. The cleaning process removes dust particles and melted materials along the edges of the scribe patterns thereby reducing shunting. We have determined that the cleaning, particularly high power ultrasonic cleaning, results in the recovery of as much as 3 percent of the cells power that would otherwise be lost if such cleaning was not conducted. The method for forming photovoltaic module 110 now will be described with reference to FIGS. 2(a) through 2(g).

In a method in accordance with the present invention, conductive transparent oxide, such as, for example, indium-tin-oxide, zinc oxide, cadmium stannate or preferably tin oxide (CTO), preferably a fluorinated tin oxide, is deposited on a substrate, such as glass, to form a front contact layer 132, or glass having the conductive tin oxide already deposited thereon can be obtained from suitable glass suppliers. The conductive transparent oxide layer is preferably less than about 10,000 Å in thickness. The tin oxide layer can have a smooth or textured surface. The textured surface is preferred for application of the photoelectric device of this invention where the greatest electric generating efficiency is desired. However, where the least amount of distortion of light coming through the partially transparent photovoltaic cell or module is desired, a smooth tin oxide surface is preferred. Such lower distortion, partially transparent photovoltaic cells and modules are particularly useful as windows or in other applications where minimizing distortion of the transmitted light is desired. Next a strip of conductive material, preferably silver (Ag) containing materials, is deposited on the outside edges of two opposite sides of CTO layer 132 to form bus bars.

Following thermal cure, if required, of the conductive material, the front contact layer 132 is laser scribed to form scribe lines 124. Following laser scribing of scribe lines 124, the remaining steps in the fabrication of the photovoltaic module as shown in FIGS. 2(c) to 2(g) as described herein are performed as described below.

It should be noted that in FIGS. 2(a) to 2(g), the front contact layer 132 is shown but the bus means are not. It should be understood, however, that bus means are disposed on front contact layer 132 in the manner described above following which the steps shown in FIGS. 2(c) to 2(g) are performed.

A photovoltaic region comprised of a substantially continuous thin film 134 of semiconductor material is fabricated over front electrodes 118 and in first grooves 124, as shown in FIG. 2(c). The semiconductor material filling first grooves 124 provides electrical insulation between adjacent front electrodes 118. Preferably, the photovoltaic region is made of hydrogenated amorphous silicon in a conventional PIN structure (not shown) and is typically up to about 5000 Å in thickness, being typically comprised of a p-layer suitably having a thickness of about 30 Å to about 250 Å, preferably less than about 150 Å, and typically of about 100 Å, an i-layer of 2000–4500 Å, and an n-layer of about 200–400 Å. Deposition preferably is by glow discharge in silane or a mixture of silane and hydrogen, as described, for example, in U.S. Pat. No. 4,064,521. Alternatively, the semiconductor material may be CdS/CuInSe$_2$ and CdTe. The semiconductor layer can comprise a single PIN type layer. However, the photovoltaic devices of this invention can have other semiconductor layers, for example, it can be a tandem or triple-junction structure. Suitable semiconductor layers useful in the photovoltaic devices of this invention and methods for their manufacture are described, for example, in United Kingdom Patent Application No. 9916531.8 (Publication No. 2339963, Feb. 9, 2000) which is incorporated herein by reference.

The semiconductor film 134 then is scribed with a laser to ablate the semiconductor material along a second predetermined pattern of lines and form second grooves 126, which divide semiconductor film 134 into a plurality of photovoltaic elements 120, as shown in FIG. 2(d). Front electrodes 118 are exposed at the bottoms of second grooves 126. Scribing may be performed with the same laser used to scribe transparent conductive oxide layer 132, except that power density is typically reduced to a level that will ablate the semiconductor material without affecting the conductive oxide of front electrodes 118. The laser scribing of semiconductor film 134 can be performed from either side of substrate 114. Second grooves 126 preferably are scribed adjacent and parallel to first grooves 124 and preferably are approximately about 20 to about 1000 micrometer in width.

A thin film of metal 136, such as one or more of silver, molybdenum, platinum, steel, iron, niobium, titanium, chromium, bismuth, antimony or preferably aluminum, is fabricated over photovoltaic elements 120 and in second grooves 126, as shown in FIG. 2(e). The conductive material filling second grooves 126 provides electrical connections between film 136 and the portions of front electrodes 118 exposed at the bottoms of second grooves 126. Conductive film 136 is formed, for example, by sputtering or other well known techniques. The thickness of film 136 depends on the intended application of the module. As an example, for modules intended to generate sufficient power to charge a 12-volt storage battery, metal film 136 typically is formed of aluminum and is about 2000–6000 Å thick.

The next step is to scribe metal film 136 with a laser to ablate the metal along a pattern of lines and form a series of grooves dividing film 136 into a plurality of back electrodes. In one such method, as taught, for example, in U.S. Pat. No. 4,292,092, because of the high reflectivity of aluminum and other metals conventionally used to form the back electrodes, the laser used to scribe the back electrode usually is operated at a significantly higher power density than those used to scribe second grooves 126 in semiconductor film 134, often 10 to 20 times higher.

For example, if metal film 136 is formed of aluminum and is about 7000 Å thick, and if the aluminum is to be directly ablated by a frequency-doubled neodymium:YAG laser emitting light having a wavelength of about 0.53 micrometers and operated in a TEM.sub.00 (spherical) mode, the laser typically would be focused to about 0.25 micrometers and operated at about 300 mW. Shorter pulse duration may reduce average laser power requirements. When the same laser is used to ablate semiconductor film 134 and form second grooves 126, it preferably is defocused to 100 micrometers and is operated at about 360 mW. Although the laser would be operated at a slightly lower power level for direct ablation of aluminum, the number of photons per second per unit area, that is, the power density of the laser, also is a function of the spot size of the laser beam. For a given power level, power density varies inversely with the square of the radius of the spot. Thus, in the example described above, the laser power density required for direct ablation of the aluminum film is about 13 times the power density required to ablate the amorphous silicon film.

It is difficult to prevent a laser operating at the power density necessary for direct ablation of aluminum from damaging the underlying semiconductor material. Specifically, the photovoltaic cell may become shorted due to molten metal flowing into the scribed groove and electrically connecting adjacent back electrodes, or due to molten metal diffusing into the underlying semiconductor material and producing a short across a photovoltaic element. In addition, where the underlying semiconductor material is comprised of amorphous silicon, the underlying amorphous silicon material may recrystallize. Moreover, in an amorphous silicon PIN structure dopants from the n-layer or p-layer may diffuse into the recrystallized amorphous silicon of the i-layer.

Therefore, after fabrication of metal film 136, the photovoltaic regions 120 underlying metal film 136 are preferably scribed with a laser operated at a power density sufficient to ablate the semiconductor material along a predetermined pattern of third lines parallel to and adjacent second grooves 126 but insufficient to ablate the conductive oxide of front electrodes 118 or the metal of film 136. More specifically, the laser must be operated at a power level that will ablate the semiconductor material and produce particulates that structurally weaken and burst through the portions of the metal film positioned along the third lines to form substantially continuous gaps in the metal film along the third lines and separate the metal film into a plurality of back electrodes. As shown in FIG. 2(*e*), where the laser beams are shown schematically and designated by reference numerals 138, laser patterning of metal film 136 by ablation of the underlying semiconductor material is performed through substrate 114.

Ablating the semiconductor material of photovoltaic regions 120 along the pattern of third lines forms third grooves or scribes 128 in the semiconductor material, as seen in FIG. 2(*f*). Third grooves 128 preferably are about 100 micrometers wide and are spaced apart from second grooves 126 by inactive portions 130 of semiconductor material. As described above, the ablation of the semiconductor material formerly in third grooves 128 produces particulates, for example, particulate silicon from the ablation of amorphous silicon, which structurally weaken and burst through the portions of metal film 136 overlying the ablated semiconductor material to form gaps 129 that separate film 136 into a plurality of back electrodes 122.

Gaps 129 preferably are substantially continuous as viewed along a line orthogonal to the plane of FIG. 2(*f*). The laser parameters required to produce continuous gaps 129 in metal film 136 will, of course, depend on a number of factors, such as the thickness and material of the metal film, the characteristic wavelength of the laser, the power density of the laser, the pulse rate and pulse duration of the laser, and the scribing feed rate. To pattern a film of aluminum having a thickness of about 2000–6000 Å by ablation of an underlying amorphous silicon film approximately 6000 Å in thickness with a frequency-doubled neodymium:YAG laser emitting light having a wavelength of about 0.53 micrometers, when the pulse rate of the laser is about 5 kHz, and the feed rate is about 13 cm/sec, the laser can be focused to about 100 micrometers in a TEM.sub.00 (spherical) mode and operated at about 320–370 mW. Under the above conditions, when the laser is operated at less than about 320 mW, portions of metal film 136 may remain as bridges across third grooves 128 and produce shorts between adjacent cells. When the laser is operated above about 370 mW, continuous gaps 129 may be produced, but the performance of the resulting module, as measured by the fill factor, may be degraded. Although the precise cause of degraded performance presently is unknown, we believe that the higher laser power levels may cause melting of portions of the amorphous silicon photovoltaic elements that remain after third grooves 128 are ablated. In addition, the increased power densities may cause the laser to cut into front electrodes 118, which would increase series resistance and, if the power density is sufficiently high, might render the module inoperable by cutting off the series connections between adjacent cells.

Figure 1:
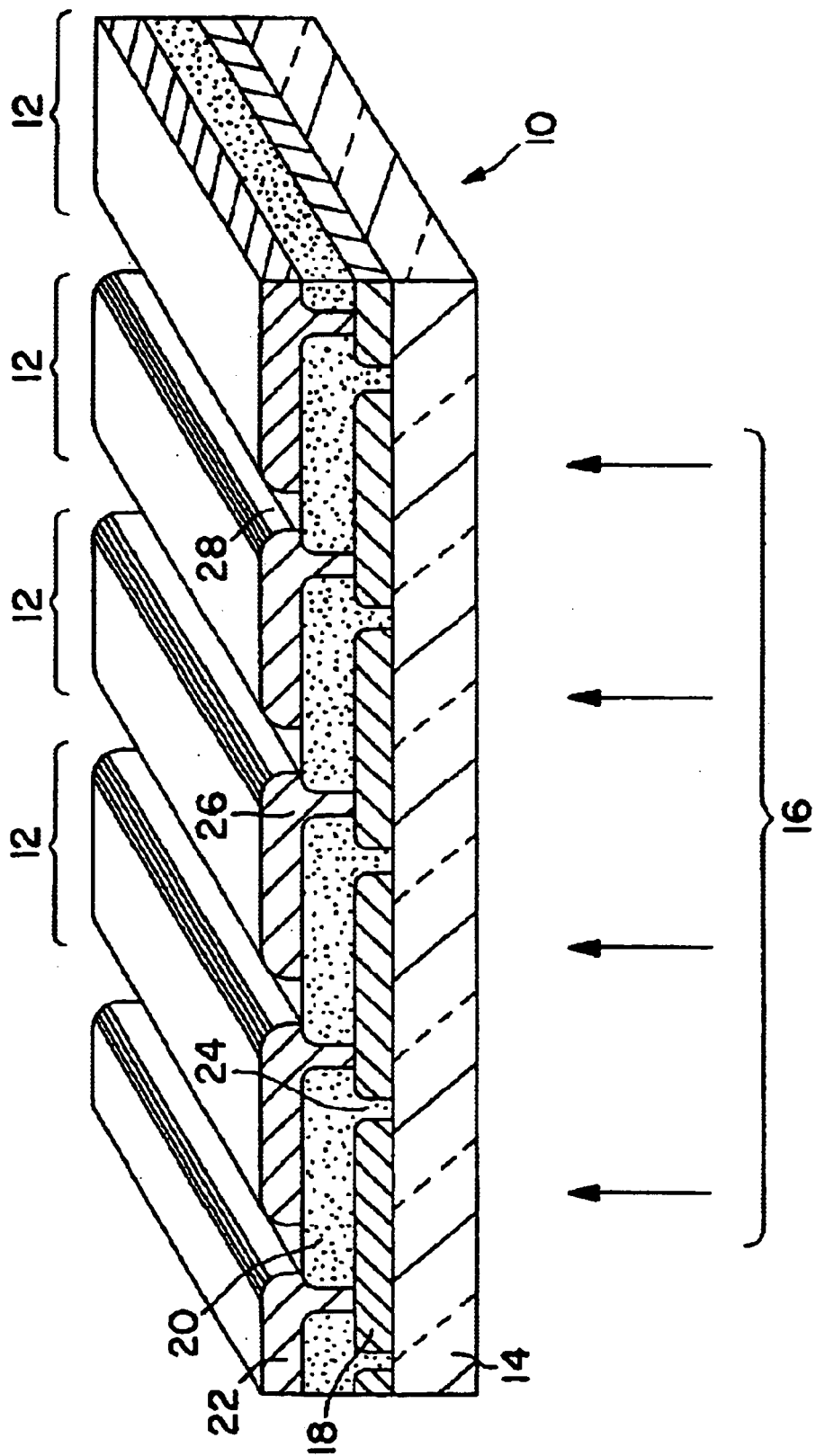
FIG. 1 is a schematic perspective view of a typical thin film photovoltaic module fabricated according to a known method.
Figure 3:
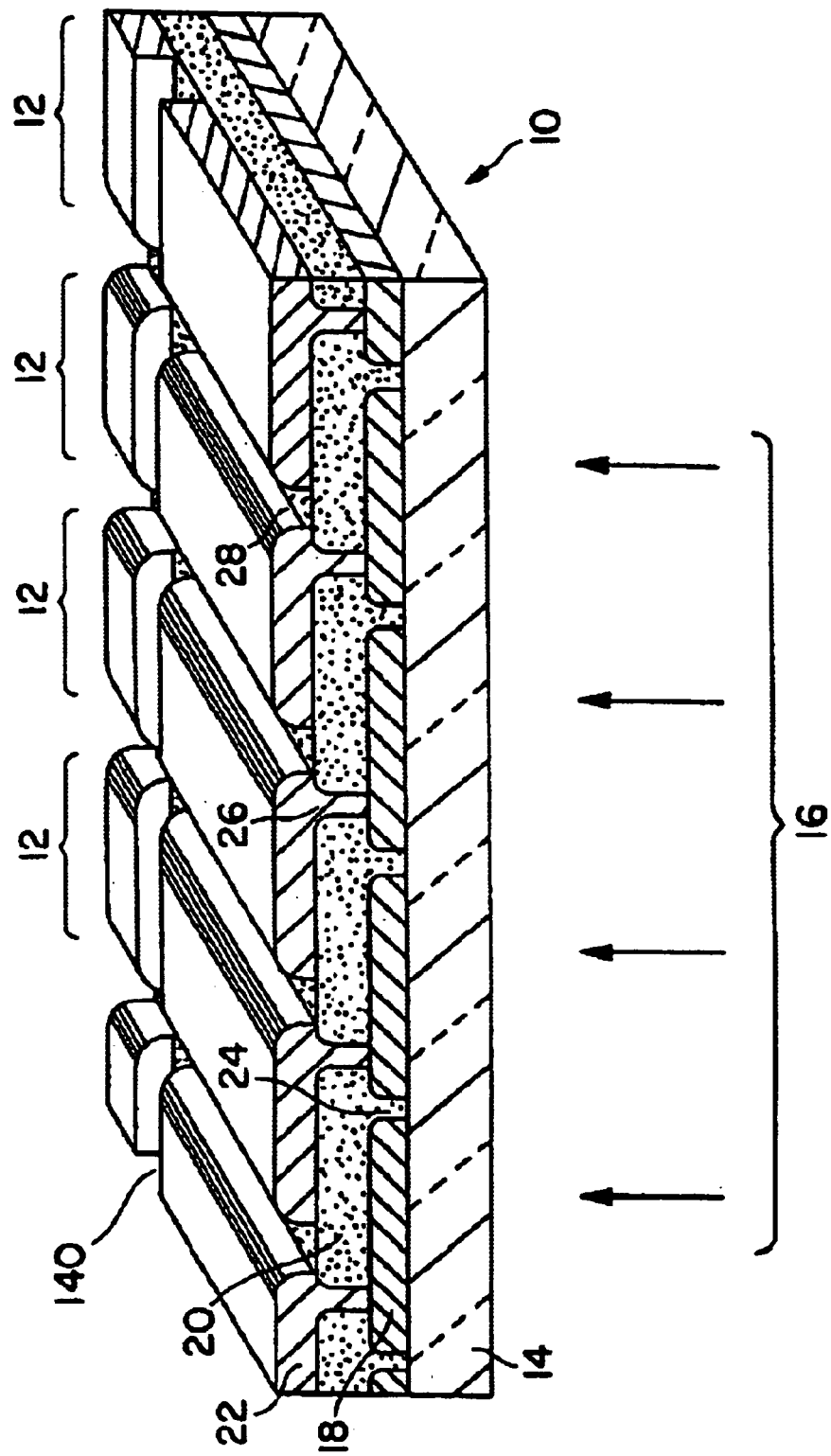
FIG. 3 is a schematic perspective view of one embodiment of this invention where a single laser scribe is positioned on the back contact of the photovoltaic module of FIG. 1 to provide for partial transparency of the photovoltaic cells and module.
Figure 4:
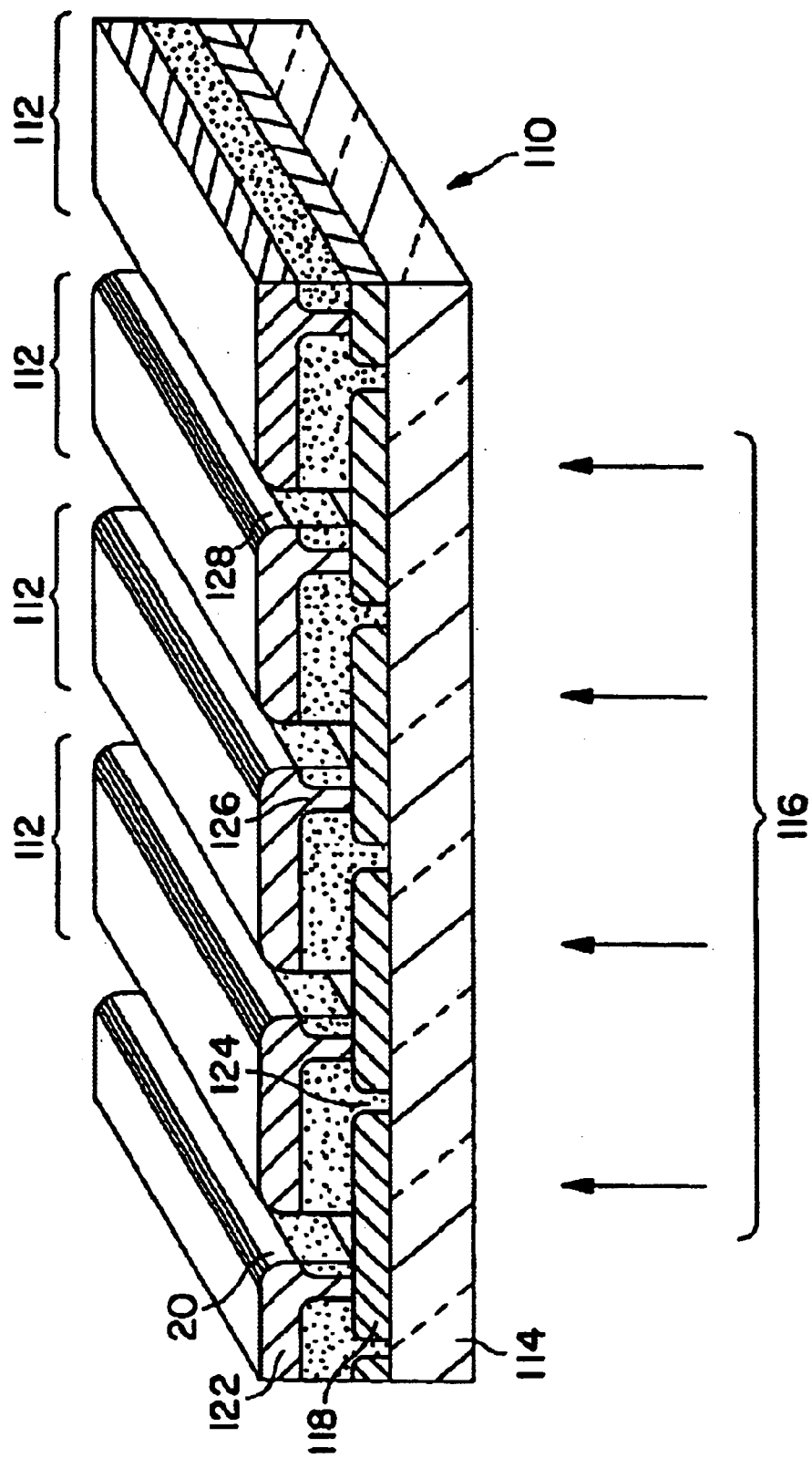
FIG. 4 is a schematic perspective view of the module of FIG. 2(g).
Figure 5:
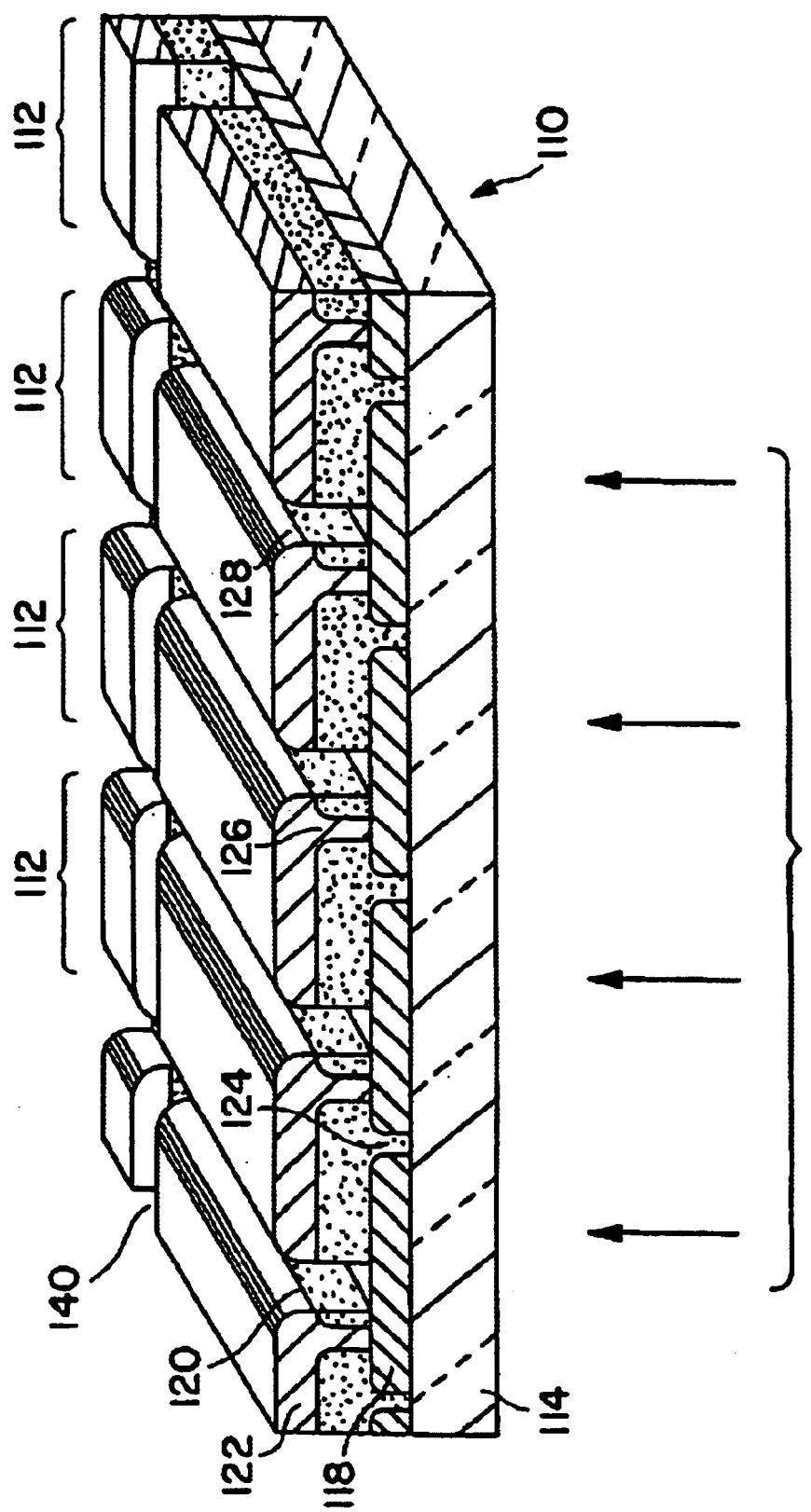
FIG. 5 is a schematic perspective view of one embodiment of this invention showing only a single laser scribe positioned on the back contact of the photovoltaic module of FIG. 4 to provide for partial transparency and where the scribe was formed by a laser directed from the substrate side of the photovoltaic module.

The next step to form the photovoltaic cells of this invention is to remove additional metal from the back contact. As described above, this metal can be removed in a preselected pattern to form lettering, a logo, or other visible feature on the photovoltaic cell. Additional metal of the back contact can also be removed to increase the transparency of the photovoltaic cell. The metal of the back contact is preferably removed by laser. If lettering, logo or other feature is desired, the metal is removed in the desired pattern using, for example, a pattern of holes on the back contact. The holes can be round, square or other shape. They can be connected or not connected to each other, or only some connected. If transparency is desired, the metal is preferably removed or ablated in grooves or scribes running across the photovoltaic cell relative to the direction of the interconnects, preferably perpendicular to the direction of the interconnects. FIGS. 3 and 5 show a three dimensional representation of one transparency scribe or groove 140 in the photovoltaic module. FIG. 3 is the same as FIG. 1 except for the added scribe 140. FIG. 5 is the same as FIG. 4 except for the added scribe 140. The numerals in FIGS. 1 and 3 refer to the same elements. The numerals in FIGS. 2(*g*), 4 and 5 refer to the same elements. In the actual module, the number of such grooves would be increased and spaced, shaped and sized as described hereinabove, in order to provide for the desired level of transparency. As shown in FIG. 3, the groove 140 extends only through the metal layer 22 to semiconductor layer 20. As shown in FIG. 5 the groove 140 extends from the metal back contact layer 122 down to the first contact 118. In FIG. 5 the groove is represented as a straight sided groove. However, as described above, this groove can be a series of connected holes.

Although removal of the back contact layer by laser scribing to form the partially transparent photovoltaic modules and cells of this invention, or to form the photovoltaic modules of this invention having designs, logos, lettering or other features can be accomplished using the techniques described hereinabove for producing gaps or grooves 128 and 129 in FIGS. 2, 4 and 5, a preferred method is to use a high repeating rate, high power laser such as Nd:YVO$_4$ laser, preferably, at about 20–100 kHz at a rapid scribing speed of, for example, about 10–20 meters per second with a spot size of, for example, 0.1 to about 0.2 mm. Such conditions can be used to form a partially transparent photovoltaic module 48 inches by 26 inches having, for example, a 5% transmission in less than about one minute. The laser beam passes through a telescope and is directed to XY scanning mirrors controlled by galvanometers. The XY scanning mirrors deflect the laser beam in the X and Y axes. The telescope focuses the beam on to the photovoltaic module and scribing rates of about 5 to 20 meters per second are achieved by this method. In another method, using a high power Eximer laser and cylindrical optics, an entire scribe line can be made in a single laser pulse. Such a laser scanning or single laser pulse technique can be used to form the interconnect and other scribe lines to form the series arranged photovoltaic cells or modules described herein, i.e., scribes or grooves 124, 126 and 128 as shown in FIGS. 4 and 5.

Figure 6:
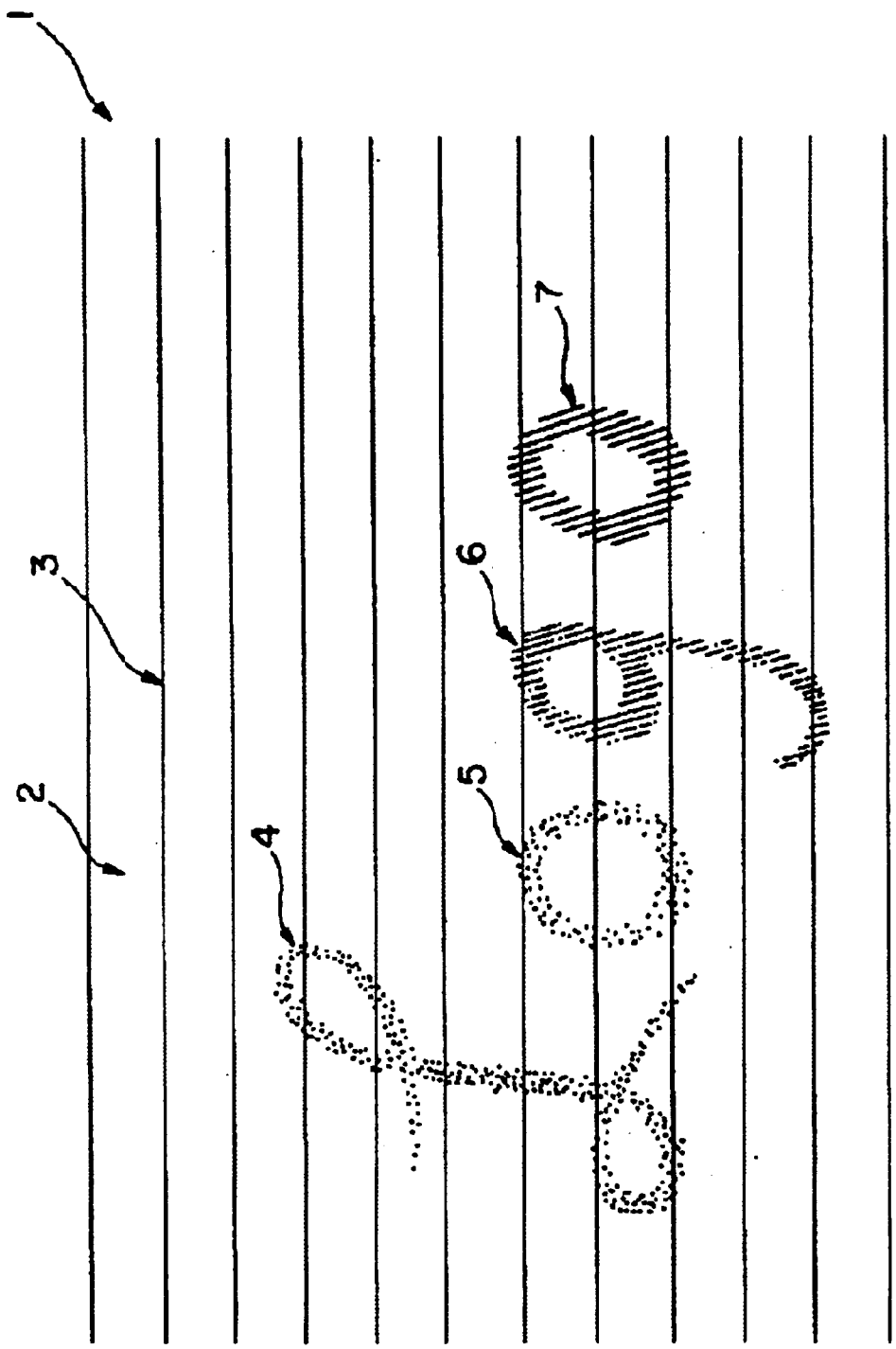
FIG. 6 is a view of a section of a thin film photovoltaic device of this invention having a "logo" formed in metal rear or back contact layer of the photovoltaic device.

FIG. 6 shows an embodiment of the invention having the word "logo" as a representative design or logo as part of the photovoltaic module. In FIG. 6, 1 is a section of a photovoltaic module of this invention. In FIG. 6, 2 is part of one cell in the module and there are eleven such sections of cells shown, although a module can have a smaller or greater number of cells. Although not shown in FIG. 6, each cell can have a layered structure as shown in FIG. 4. That is, each cell 2 in FIG. 6 can correspond to a cell 112 in FIG. 4. In FIG. 6, the dark lines 3 and the "dots" forming the letters "L", "o", "g", and "o", represent regions of the module where the metal back or rear contact is not present. Thus, these regions of the module would transmit light and when the module is viewed with a source of light from behind the module. Lines 3 and the letters spelling "logo" would be visible to a viewer of the module. Lines 3 in FIG. 6 represent the scribes or grooves that separate the back or rear contact so that there is one back or rear contact per cell in the module. Scribe lines or grooves 3 can correspond to grooves 128 in FIG. 4. Letters 4, 5, 6 and 7 in FIG. 6 are a pattern of holes in the back or rear contact formed, for example, by selective removal of the metal layer in the back or rear contact by a laser scribing process such as one or more of the processes described herein In FIG. 6, the letter "L" identified as 4 in FIG. 6 is a pattern of round holes, some of which are connected or overlap with each other. The letter "o" identified as 5 in FIG. 6 is similarly formed by a pattern of round holes. The letter "g" identified as 6 in FIG. 6 is formed by rows of round holes where some of the holes are connected. The letter "o" identified as 7 in FIG. 6 is also formed by a row of holes in the metal back contact layer where all the holes are connected or overlap. The holes which form the letters in FIG. 6 can have, for example, a diameter of about 0.1 to about 0.2 mm. In FIG. 6, the section of the module is viewed from the substrate side of the module. That is, in FIG. 6, the module is being viewed from the same side light would enter the module for conversion of the light to electrical current.

In another embodiment of this invention, rather than space the grooves or scribe lines evenly across the surface of the photovoltaic cells and module to form a partially transparent photovoltaic cell and module of this invention, the scribes or grooves to produce the partial transparency can be grouped in bands where, in each band, each scribe line is closely spaced. Bands of closely spaced scribe lines can alternate with bands having no or very few scribes or grooves for partial transparency. A photovoltaic module made in such a manner with alternating bands has a "Venetian Blind-like" appearance. Such a photovoltaic module is aesthetically appealing. In one such embodiment, high transmission bands, for example bands about 0.5 to 2 cm wide with transmission of 20–40% are alternated with opaque bands, for example, having a transmission of less than about 5%, more preferably less than about 1%, having a width of about 0.5 to about 1.0 cm. A Venetian Blind-like photovoltaic device can also be made by mounting strips of a photovoltaic panel, for example, strips of a photovoltaic device made on plastic or metal as a substrate, onto glass or some other transparent substrate.

In other embodiments of the invention, the partially transparent photovoltaic cells and modules of this invention can have other arrangements or configurations for the scribes or grooves used to impart partial transparency. The modules of this invention can have scribes or groves that impart partial transparency where the distance between the scribes within a module is graded either for the entire module or only a portion therof. For example, proceeding from one end of the module to the other end of the module the distances or spaces between the scribes used to provide partial transparency as described herein above can increase or decrease in a graded manner. For example, in a linear grading, a square root grading or by a logarithmic grading or other suitable grading. Thus, the resulting module has a graded level of transmission of light proceeding from one end of the module to the other, such as, for example, 1 to about 5% transmission of light at one end of the module and 10 to about 50% transmission at the other end of the module. The first two scribes on one end of the module can be separated by about 0.2 to about 1 mm and the last two on the other end of the module can be separated by about 0.5 to about 5 mm with the distance between the intervening scribes increasing gradually and, preferably, in a linear grading, a square root grading or by a logarithmic grading. In a logarithmitic type of grading, for example, the first scribe would be separated from the second scribe by log(2) mm, the spacing between the second and the third scribe would be log(3) mm, the spacing between the third and the fourth scribe would be log(4) mm, and so forth. In another embodiment, the scribes or groves used to impart partial transparency can, as described herein above, be grouped in bands having a plurality of scribes separated by bands of few or no scribes where, within the bands having the plurality of scribes, the distance between each scribe is graded as described above. In yet another embodiment, the modules of this invention have bands having a plurality of scribes either spaced from each other with the regular spacing as described herein above or with the graded spacing as described hereinabove, where such bands are separated by bands having few or no scribes, and where the bands having few or no scribes have a width which is graded from one end of the module to the other end. Such grading can be, for example, linear, square root grading or logarithmic grading, or other suitable grading. The bands as described herein above either with a plurality of scribes or with few or no scribes can have any desired width. However, the width of such bands generally is about 0.2 to about 5 cm. As used herein, with respect to describing a band, having few scribes preferably means that the band has a transparency of no more than about 5%, preferably no more than about 1%. As used herein, transmission means the percentage of light incident on the modules or region of the module that passes through the module or region of the module.

Following the laser scribing to form the photovoltaic modules of this invention, it is preferable to anneal the module. We have discovered that annealing the module improves performance of the module, for example, by decreasing shunting loss. For example, the scribed module can be annealed in air at a temperature of 150 to about 175° C. for 0.5 to about 1.0 hour.

As mentioned above, partially transparent photovoltaic cells and modules, and particularly the partially transparent photovoltaic cells and modules of this invention, or cells or modules comprising a logo, design, descriptive pattern, sign or other feature, particularly such cells and modules made according to this invention, or a combination thereof either separately or on the same cell or module (i.e., a module having scribes imparting partial-transparency as well as the logo, design, descriptive pattern, sign, etc. on the same cell or module) are suitable for forming canopies. In one particular preferred use these cells and modules form or are part of a canopy over a fuel filling station such as a station used by consumers to fuel their automobiles or trucks or other vehicles with gasoline, diesel or other fuel. The partially transparent photovoltaic cells and modules are particularly useful for this purpose because they allow for the partial transmission of light, particularly sunlight, thereby providing natural light for the consumer or other user of the fuel to perform the desired operation under the canopy, and at the same time the canopy can be used to generate electric current from, for example, sunlight, thereby providing electrical power for the fuel filling station or for other uses. For example, the electric current generated can be distributed to the local electric power grid if either all or part of the electric is not utilized by the fuel filling station. Thus, the canopies of this invention can provide for protection from rain, snow and other elements, as well as from the full heat and radiation of the sun, yet provide for the transmission of light to allow the consumer or other person beneath the canopy to have natural light to proceed with their intended operations such as fueling a vehicle, and/or to provide for a logo, design, descriptive pattern, sign (letters etc.) and the like overhead of the consumer or other person beneath the canopy.

The canopy of this invention useful for a fuel filling station can have only a percentage of the surface of the canopy containing the partially transparent cells or modules, preferably the partially transparent cells and modules of this invention and/or cell and modules having a logo, design, descriptive pattern, sign and the like. For example, from about 10% of the total surface area of the canopy to about 99% of the surface area. However, the amount of area of the canopy containing the photovoltaic cells or modules is not limited and can be greater than 50% of the total surface area of the canopy. For example it can cover at least 70%, or at least 75% or even at least 80% or 90%. In some applications, at least 95% of the surface area of the canopy is one or more of the partially transparent photovoltaic cells or modules, preferably the partially transparent photovoltaic cells or modules of this invention. As described herein, the amount of light transmitted by each cell or module can also vary depending on the desired amount of light to be transmitted through the canopy.

The canopy over the fuel filling station containing the partially transparent photovoltaic cells and modules, particularly the partially transparent photovoltaic cells of this invention and/or cells or modules comprising a logo, design, descriptive pattern, sign, and the like, can have any shape. For example it can be flat, or curved upward or downward. It can be a flat canopy, but on an incline. The incline can be adjustable to account for different elevations of the sun so as to maximize the conversion of sunlight to electricity. It can also be in the shape of a pitched-roof type of canopy.

The photovoltaic cells and modules can, for example, be mounted on the canopy in one or more frames made from, for example, metal, plastic or other suitable material. Or they can, for example, be mounted on a transparent substrate such as glass or plastic which is attached to and part of the canopy.

Figure 7:
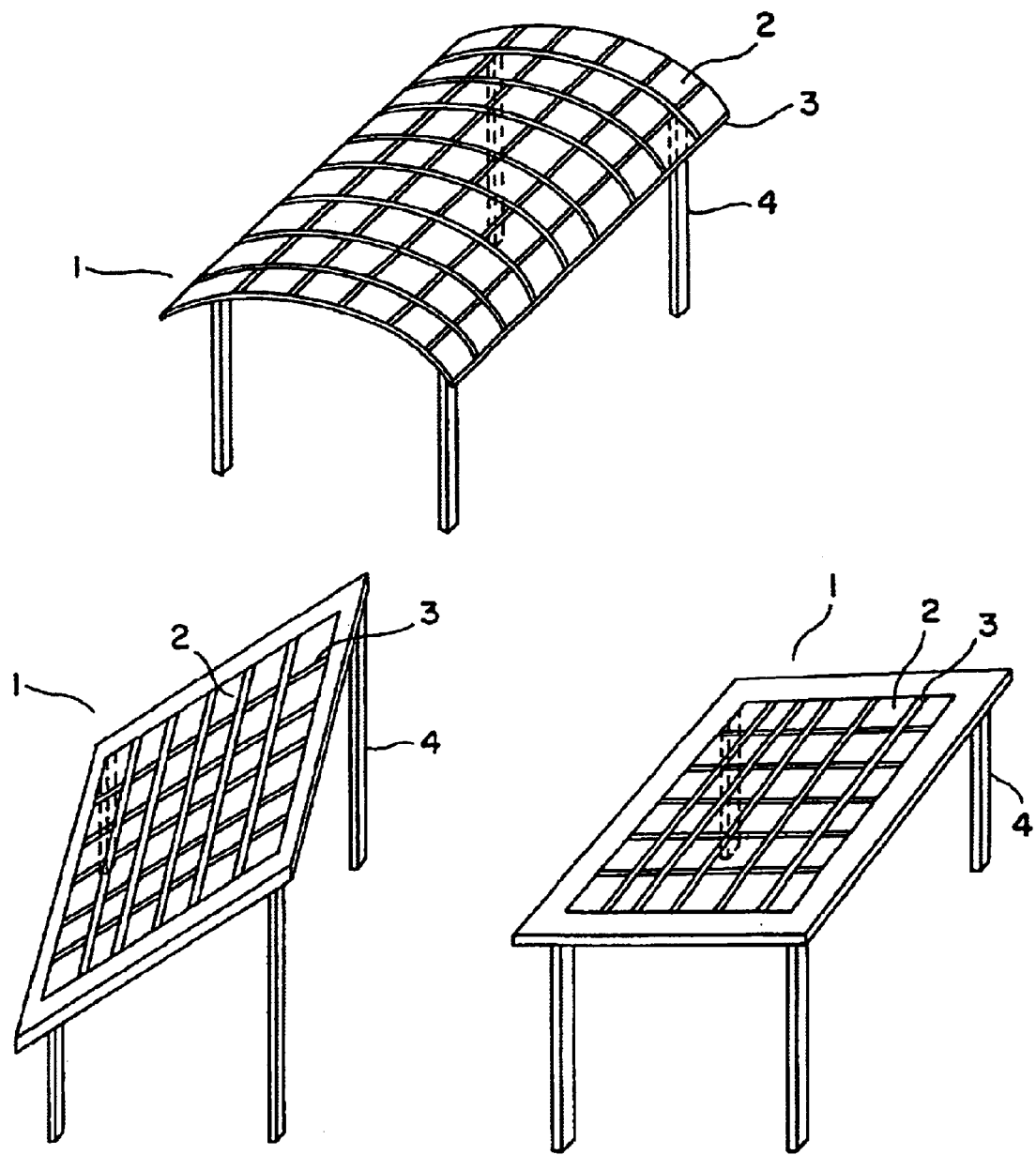
FIG. 7 is a view of canopies that can be constructed using photovoltaic devices of this invention.

FIG. 7 is a drawing of an example of a curve-shaped canopy with the curve extending in an up direction, a flat canopy, and a flat canopy that is tilted or at an angle. In FIG. 7, 1 is the canopy, 2 are preferably partially transparent photovoltaic cells or preferably modules, preferably the partially transparent photovoltaic cells or modules of this invention and/or the cells or modules having a logo, design, descriptive pattern, sign(letters etc.) and the like either separately from or on the same cell or module as the cell or module with the partial transparency scribes, 3 is a frame for holding the cells or riodules, and 4 are columns for supporting the canopy over the fuel filling station. The canopies described herein are particularly useful for canopies over fuel filling stations. They are also useful for covering other operations where it is desirable to have the combination of light transmission through the canopy and a canopy that can generate electric power.

Provisional Patent Application Nos. 60/216,415 filed Jul. 6, 2000, No. 60/220,346 filed Jul. 24, 2000 and No. 60/221,627 filed Jul. 28, 2000, and the patents referred to herein by number are incorporated herein by reference in their entirety.

EXAMPLES

Example 1

A partially transparent photovoltaic (PV) module with 5% transmission line pattern was made from what was otherwise a thin-film, amorphous silicon BP Solar production PV module (26×48 inches, MV) as follows.

The apparatus used was a high power Nd:YVO4 laser capable of working at 100 kHz and output about 10 W; an XY scanner with mirrors coated for high power laser applications; a laser focusing lens; a beam expander and two mirrors. The XY scanner was a combination of X and Y axis mirrors each controlled by a galvanometer. The focusing lens was mounted on a micrometer that allowed adjustment of the laser focus accurately. The laser beam from the laser was collimated by the beam expander and then directed to the focusing lens by two mirrors. The focused laser beam was projected to the work surface by the XY scanning mirrors. The galvanometers positioned the beam to the desired location on the PV module. The laser beam was directed from the glass substrate side of the module. The micrometer controlled focusing lens was used to adjust the lens position to make sure the entire module was processed uniformly. The XY scanner was controlled by a computer. By controlling the X and Y mirror positions, the laser beam location on the PV plate was accurately controlled. For the 5% line pattern, the beam was scanned along the X direction which is perpendicular to the direction of the interconnects. The scribe lines were about 2 mm apart and extended from one buss bar to the other buss bar on the PV module. The laser scribe lines removed the back aluminum contact and the semiconductor material of the PV module but left the front contact intact. The distance between the focusing lens (also XY mirrors) and the surface of the PV module was about 1800 mm, the average laser power used was about 8 W and the laser pulse repetition rate was 50 kHz. The spot size of the laser at the surface of the PV module was about 0.15 mm in diameter. The scan rate was about 7.5 meters per second and the entire PV module was completed in less than 1 minute to produce a PV module having 5% transmission (about 5% of the incident light passing through the module.)

After laser scribing the partially transparent PV module was washed in a high power ultrasonic tank using water, and then it was dried and annealed at 175 C. for one hour. The operations above were performed prior to sealing a second glass plate to the thin-film module formed on the glass substrate.

Example 2

A partially transparent photovoltaic (PV) module with 10% transmission line pattern was laser prepared as follows.

Same as Example 1, except the scribe line spacing was reduced to about 1 mm.

Example 3

A dynamic focusing unit was used to replace the focusing lens in Example 1. The dynamic focusing ensured the laser focused on the working surface at all times during the laser scanning, leading to more uniform coverage across the PV module.

Example 4

Examples 1 and 3 were repeated except, for more robust production, two laser mirrors were removed and the laser beam, beam expander, focusing system (focus lens or dynamic focusing unit) and the entrance of the XY scanner were made coaxial.

Example 5

To produce a logo, design, or other pattern on the PV module (either a partially transparent module containing scribe lines perpendicular to the interconnects or a non-transparent module) the logo, design or other pattern was transformed into a vector format using HP graphics language (hpgl). Using the apparatus described in Example 1, a computer directed the laser beam to the location on the module according to the vector file. The laser ablated (removed) the back contact where directed by the vector file and the computer making that portion of the PV module transparent and thereby forming the module having the logo, design or other pattern featured on the module.

That which is claimed is:

1. A method for making a thin film partially transparent photovoltaic module comprising series connected cells, at least one semiconductor layer, a metal contact layer, and interconnects connecting the series connected cells, the method comprising laser scribing a plurality of laser scribes at least through the metal contact and positioning the scribes in a direction that crosses the direction of the interconnects.

2. The method of claim 1 further comprising bus bars located adjacent the first and last cell in the module and wherein the scribes extend across the surface of the photovoltaic module but not including the bus bars.

3. The method of claim 1 wherein the laser scribes are formed by using a laser to ablate semiconductor material which bursts through the metal contact layer to form the scribes.

4. The method of claim 3 wherein the laser used to ablate the semiconductor material is selected form the group consisting of Nd-YAG, Nd:YFL and Nd:YVO$_4$ lasers.

5. The method of claim 1 wherein each scribe has a width of about 0.01 to about 0.5 mm and the scribes are spaced from each other about 0.5 to about 5 mm.

6. The method of claim 5 wherein each scribe has a width of about 0.05 to about 0.2 mm.

7. The method of claim 6 wherein the scribes are spaced from each other about 0.5 to about 2 mm.

8. The method of claim 6 wherein no more than about 50 percent of the area of the metal contact layer comprises the laser scribes.

9. The method of claim 6 wherein no more than about 20 percent of the area of the metal contact layer comprises the laser scribes.

10. The method of claim 1 wherein the laser scribes are positioned in a direction that is perpendicular to the direction of the interconnects.

11. The method of claim 1 wherein the scribes are in the form of a series of interconnected holes.

12. The method of claim 11 wherein the holes are round and have a diameter of about 0.1 to about 0.2 mm.

13. The method of claim 1 wherein the scribes are parallel to each other.

14. The method of claim 1 wherein the scribes are grouped in bands of closely spaced scribes separated by bands having few or no scribes.

15. The method of claim 14 wherein each scribe has a width of about 0.05 to about 0.2 mm and are spaced from each other about 0.5 to about 2 mm.

16. The method of claim 1 wherein the laser scribes are spaced from each other and the spacing is graded in at least a portion of the module.

17. A method of manufacturing a photovoltaic device on a substrate, comprising the steps of:
(a) depositing a transparent conductive oxide film on a substrate to form a front contact layer;
(b) laser scribing substantially parallel first grooves in the front contact layer with a laser beam to form front electrode segments on the substrate;
(c) depositing and forming a layer or layers of a semiconductor material on said front electrode segments, and filling the first grooves with the semiconductor material;
(d) laser scribing second grooves in the layer or layers of semiconductor material at positions substantially parallel to the first grooves;
(e) depositing and forming a back contact layer comprising a metal on the layer or layers of semiconductor material, and filling the second grooves with the metal to form a series connection to connect the front electrode segments and the back contact layer;
laser scribing third grooves in the back contact layer at positions substantially parallel to the second grooves with a laser beam; and
(g) laser scribing grooves in the back contact layer at a direction which crosses the direction of the second groove.

18. The method of claim 1 further comprising annealing the module after laser scribing the plurality of laser scribes.

19. The method of claim 1 further comprising ultrasonically cleaning the module after laser scribing the plurality of laser scribes.

* * * * *

UNITED STATES PATENT AND TRADEMARK OFFICE
CERTIFICATE OF CORRECTION

PATENT NO. : 6,858,461 B2
DATED : February 22, 2005
INVENTOR(S) : Robert S. Oswald and Shengzhong Liu Page 1 of 1

It is certified that error appears in the above-identified patent and that said Letters Patent is hereby corrected as shown below:

<u>Column 1,</u>
Line 9, insert the following:
-- This Invention was made with Government support under contract DEFC3697GO10245 awarded by DOE. The Government has certain rights in this invention. --.

Signed and Sealed this

Twenty-seventh Day of December, 2005

JON W. DUDAS
*Director of the United States Patent and Trademark Office*